(12) United States Patent
Li et al.

(10) Patent No.: US 7,532,074 B2
(45) Date of Patent: May 12, 2009

(54) DEVICE AND METHOD FOR BIASING A TRANSISTOR AMPLIFIER

(75) Inventors: Ping Wai Li, Shatin, N.T. (HK); Chi Lap Yuen, Shatin, N.T. (HK); Chun Tak Chow, Shatin, N.T. (HK)

(73) Assignee: Kontel Data System Limited, Shatin, N.T. (HK)

( * ) Notice: Subject to any disclaimer, the term of this patent is extended or adjusted under 35 U.S.C. 154(b) by 8 days.

(21) Appl. No.: 11/774,986

(22) Filed: Jul. 9, 2007

(65) Prior Publication Data

US 2009/0015337 A1    Jan. 15, 2009

(51) Int. Cl.
*H03F 3/04* (2006.01)
(52) U.S. Cl. ........................ 330/296; 330/285
(58) Field of Classification Search ................ 330/296, 330/285, 289, 298, 207 P
See application file for complete search history.

(56) References Cited

U.S. PATENT DOCUMENTS

| 7,009,453 | B2 * | 3/2006 | Kuriyama ................ 330/289 |
| 7,332,968 | B2 * | 2/2008 | Luo ........................ 330/296 |
| 7,355,480 | B2 * | 4/2008 | Honda ..................... 330/296 |
| 7,358,817 | B2 * | 4/2008 | Kao et al. ................. 330/296 |
| 7,365,604 | B2 * | 4/2008 | Luo et al. ................. 330/296 |

FOREIGN PATENT DOCUMENTS

| CN | 1374754 A | 10/2002 |
| JP | 7-31149 | 1/1995 |
| JP | 7-244111 | 9/1995 |
| JP | 8-66011 | 3/1996 |

OTHER PUBLICATIONS

Fürst, Claus Erdmann. "A Low-Noise/Low-Power Preamplifier for Capacitive Microphones," IEEE, 1996, pp. 477-480, 0-7803-3073-0/96.

* cited by examiner

*Primary Examiner*—Henry K Choe
(74) *Attorney, Agent, or Firm*—Stephen M. De Klerk; Sonnenschein, Nath & Rosenthal, LLP

(57) ABSTRACT

A biasing circuit adapted for operative coupling to the first input terminal so as to provide a relatively high biasing impedance to ground at the first input terminal, said biasing circuit being adapted to controllably vary the DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

21 Claims, 4 Drawing Sheets

DEVICE AND METHOD FOR BIASING A
TRANSISTOR AMPLIFIER

TECHNICAL FIELD

The present invention relates to an apparatus and method for biasing a transistor amplifier and in particular, FET transistor amplifiers which are fabricated on integrated circuit chips.

BACKGROUND OF THE INVENTION

Metal Oxide Semiconductor Field Effect Transistors (MOSFETs) and Junction Field Effect Transistors (JFETs) are often used as the building blocks of low-noise amplifier devices fabricated on integrated circuit chips. Such amplifiers are useful for instance in audio applications, capacitive sensor applications, and thermal sensor detection applications where it is important to minimise the adverse effects of noise arising from, amongst other things, the DC-voltage bias source, and the electronic elements which comprise the biasing circuitry.

Amplifiers which are built from MOSFETs and JFETs tend to have very large input impedances and as such, it is important that the biasing circuitry also has a biasing impedance which is not much smaller than the input impedance of the amplifier to ensure efficient operation of the amplifier. The relatively high impedance of the biasing circuitry may also be utilised in combination with a capacitor to form a low-pass filter which may be used to filter out noise arising from the biasing circuitry. FIG. 3 shows an example of a prior art biasing network which is arranged in parallel with a capacitor (C) so that it simultaneously provides low-pass filtering at the input of an amplifier. FIG. 4 graphically represents the relationship between the noise output (kT/C) of the biasing network in parallel with the capacitor (C) as a function of impedance.

Ideally, the bandwidth of noise arising from the biasing network shown in FIG. 3, is controlled by either adjusting the value of the capacitor (C) or the impedance. In practice, because the magnitude of the capacitor (C) is limited by the transducer design, the bandwidth of the noise is limited by increasing the magnitude of the impedance (typically in the tens of Giga-Ohms). However, where the biasing network is to be implemented on an integrated circuit, it is extremely difficult to provide a high impedance value in an area-efficient manner.

SUMMARY OF THE INVENTION

The present invention seeks to alleviate at least one of the problems described above associated with the prior art.

The present invention involves several different broad forms. Embodiments of the invention may include one or any combination of the different broad forms herein described.

In a first broad form, the present invention provides a device for use in biasing a transistor amplifier with a DC-voltage signal, the transistor amplifier including:

a first input terminal;

a second input terminal; and an output terminal coupled to the second input terminal;

wherein said device includes:

a biasing circuit adapted for operative coupling to the first input terminal so as to provide a relatively high biasing impedance to ground at the first input terminal, said biasing circuit being adapted to controllably vary the DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

Typically, the transistor amplifier may include a CMOS amplifier. Also typically, the CMOS amplifier may include at least one of a MOSFET and a JFET.

Preferably, the first input terminal includes a positive input terminal of the transistor amplifier, and, the second input terminal includes a negative input terminal of the transistor amplifier.

Preferably, the biasing circuit includes a resistor-divider for controllably varying the DC-voltage signal.

Preferably, the biasing circuit also includes a sub-circuit adapted to mirror the DC-voltage signal produced by the resistor-divider at an output node of the sub-circuit. More preferably, the sub-circuit includes at least one of a diode, a MOSFET and a JFET. Typically, the diode, MOSFET and JFET include at least one of a p-n and Schottky-type diode, MOSFET and JFET respectively.

Preferably, the low-pass circuit may include a capacitor operatively coupled with at least one of a diode, a MOSFET, and a JFET of the biasing circuit, wherein the capacitor forms a first low-pass filter with an impedance of the at least one diode, MOSFET and JFET.

Preferably, the present invention includes a control current source adapted to automatically trigger adjustment of an impedance of at least one of a diode, MOSFET and JFET of the sub-circuit whereby said adjustment configures the sub-circuit to mirror the DC-voltage signal of the resistor-divider at the output node of the sub-circuit. Typically, the control current source is variable by reference to an output of the resistor-divider.

Typically, a capacitive sensor may be operatively coupled to the first input terminal of the transistor amplifier. Preferably the capacitive sensor may be coupled in parallel with the biasing circuit.

Typically, the capacitive sensor may include a capacitive sensor of a microphone. Also typically, the capacitive sensor may be adapted to receive a supply voltage signal from a voltage-multiplier device in series with the capacitive sensor.

Preferably, a second low-pass filter may be operatively coupled between the voltage multiplier device and the capacitive sensor. The second low-pass filter may be adapted to filter out a voltage ripple in the supply voltage signal before the supply voltage signal is fed to the capacitive sensor, the voltage ripple being produced during voltage step-up conversion of the supply voltage signal by the voltage multiplier device.

Preferably, the low-pass filter includes a capacitor operatively coupled with a first and second diode, said first and second diodes being coupled in parallel between a terminal of the capacitor and an output terminal of the voltage multiplier device, said first and second diodes being arranged in reverse polarity relative to each other whilst in the parallel configuration.

Typically, the sub-circuit of the biasing circuit may include a PMOS and an NMOS MOSFET, wherein the drains of the PMOS and NMOS MOSFETs are operatively coupled to the first input terminal of the transistor amplifier, and gates of the PMOS AND NMOS MOSFETS are operatively coupled to different voltage potentials of the resistor-divider.

Preferably, at least one of the PMOS and NMOS MOSFETS are adapted to form a low-pass filter with the capacitive sensor coupled to the first input terminal of the transistor amplifier.

Typically, the device may be fabricated on an integrated circuit chip. Also typically, the device may be fabricated on the integrated circuit chip using a MEMS fabrication process.

In a second broad form, the present invention provides a low-pass filter adapted for use in filtering out a voltage ripple in a supply voltage signal, the voltage ripple being generated by a voltage multiplier device during voltage step-up conversion of the supply voltage signal before said supply voltage signal is fed to a capacitive sensor, the low-pass filter including a capacitor operatively coupled with a first and second diode, said first and second diodes being adapted for operative coupling in parallel between a terminal of the capacitor and an output terminal of the voltage multiplier device, said first and second diodes being arranged in reverse polarity relative to each other in parallel.

Preferably, the low-pass filter is fabricated on an integrated circuit chip.

Preferably, the capacitive sensor and the voltage multiplier device are fabricated on the integrated circuit chip. More preferably, the low-pass filter is fabricated on the integrated circuit chip using a MEMS fabrication process.

In a third broad form, the present invention provides a transistor amplifier including:
- a first input terminal;
- a second input terminal;
- an output terminal coupled to the second input terminal; and
- a biasing circuit adapted for operative coupling to the first input terminal so as to provide a relatively high biasing impedance to ground at the first input terminal, said biasing circuit being adapted to controllably vary a DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

In a fourth broad form, the present invention provides a method of biasing a transistor amplifier with a DC-voltage signal, the transistor amplifier including:
- a first input terminal;
- a second input terminal; and
- an output terminal coupled to the second input terminal;

wherein the method includes the steps of:
(a) operatively coupling a biasing circuit to the first input terminal, wherein said biasing circuit is adapted to provide a relatively high biasing impedance to ground at the first input terminal;
(b) selectably adjusting the DC-voltage signal with the biasing circuit, wherein at least one component of the biasing circuit is configured to simultaneously form a low-pass circuit for filtering a noise component of the DC-voltage signal before the DC-voltage signal is provided to the first input terminal.

It would be appreciated by a person skilled in the art that at least one advantage of the present invention is in providing a biasing circuit for an amplifier which simultaneously provides a high impedance to ground, a variable biasing voltage, and a low-pass filter which assists in filtering out noise from the bias voltage applied to the amplifier input. This may be particularly advantageous in the context of MEMS technology where spatial limitations on integrated circuit chips must be taken into consideration and it is impractical to fabricate separate circuits dedicated to providing each of the above functions.

BRIEF DESCRIPTION OF THE DRAWINGS

The present invention will become more fully understood from the following detailed description of a preferred but non-limiting embodiment thereof, described in connection with the accompanying drawings, wherein.

DETAILED DESCRIPTION OF EMBODIMENTS OF THE INVENTION

Figure 1:
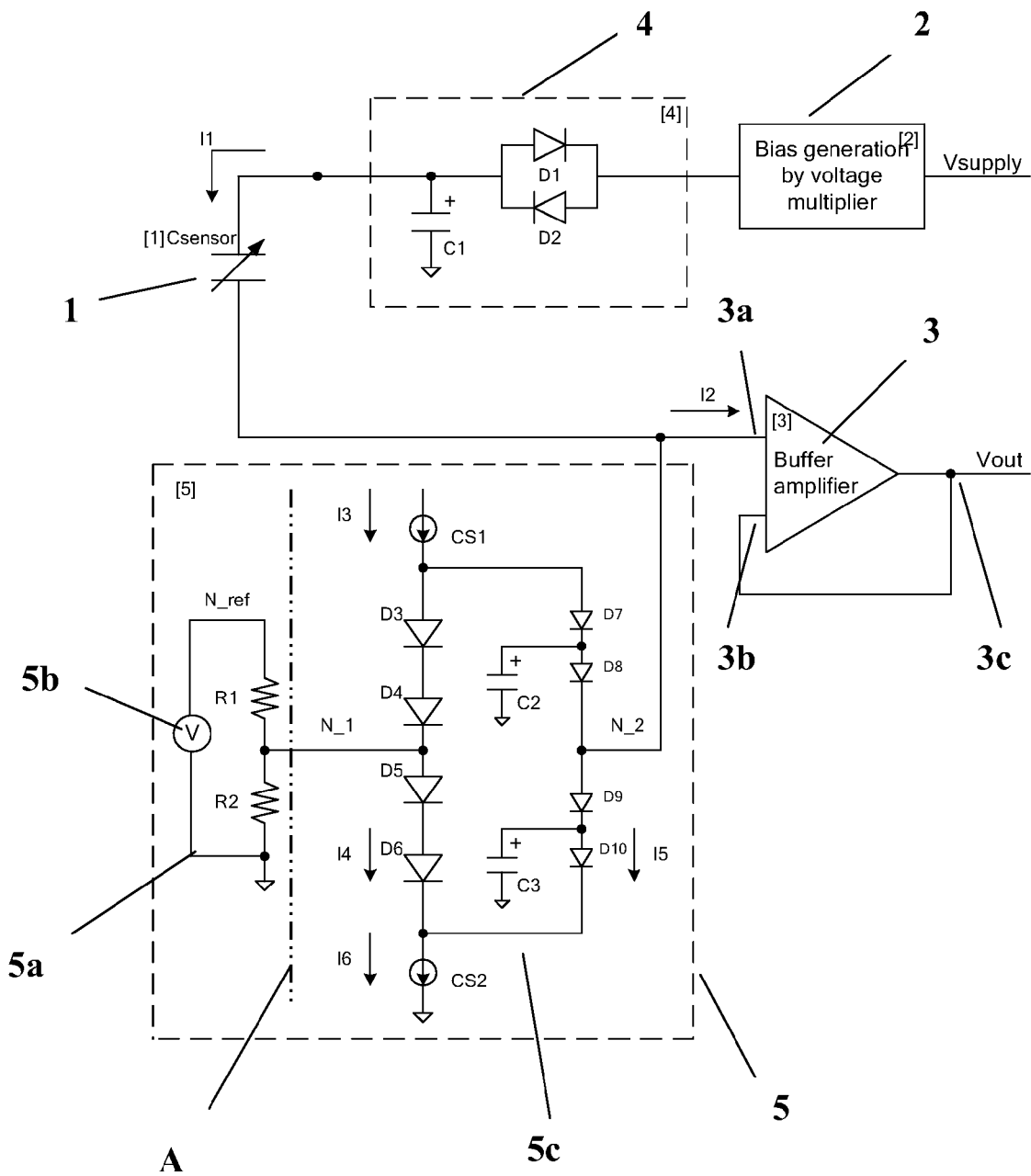
FIG. 1 shows a circuit diagram of a first embodiment of the present invention operatively interfaced with a buffer amplifier.

Referring firstly to FIG. 1, a first embodiment device is shown operatively coupled to a buffer amplifier (3) for biasing the buffer amplifier (3) with a DC-voltage signal. The device and buffer amplifier (3) are fabricated on an integrated circuit.

The buffer amplifier (3) is a FET amplifier having a first (positive) input terminal (3a), a second (negative) input terminal (3b) and an output terminal (3c). The output terminal (3c) is bootstrapped to the second input terminal (3b) via a feedback loop.

A capacitive sensor (1) is operatively coupled to the first input terminal (3a) of the buffer amplifier (3). By way of example only, the capacitive sensor (1) is part of an electret microphone. The capacitive sensor's (1) capacitance varies according to as received input signal—hereinafter referred to as $V_{supply}$ which is to be transduced.

$V_{supply}$ is fed to the capacitive sensor (1) from a voltage-multiplier device (2) which is arranged in series with the capacitive sensor (1). The voltage multiplier device (2) generates a high voltage bias for the capacitive sensor (1) from a relatively low $V_{supply}$ signal.

A low-pass filter (4) is operatively coupled between the voltage multiplier device (2) and the capacitive sensor (1) which filters out a voltage ripple in $V_{supply}$ before $V_{supply}$ is fed to the capacitive sensor (1). The voltage ripple is produced during voltage step-up conversion of $V_{supply}$ by the voltage multiplier device (2).

The low-pass filter (4) includes a capacitor (C1) operatively coupled with a first and second diode (D1,D2). More specifically, the first and second diodes (D1,D2) are coupled in parallel between a positive terminal of the capacitor (C1) and an output terminal of the voltage multiplier device (2). The negative terminal of the low-pass filter capacitor (C1) is grounded. The diodes (D1,D2) are arranged in reverse polarity relative to each other whilst in the parallel configuration. The relatively high impedances of the diodes (D1,D2) provide for an extremely-low cut-off frequency which reduces the effects of voltage ripple in $V_{supply}$ before $V_{supply}$ is fed to the capacitive sensor (1).

The diodes D1 and D2 of the low-pass filter are a proprietary configuration which form a very large impedance, yet with a relatively small area. A large impedance is provided by the combination of the diodes (D1,D2) in parallel when current 11 is very small. In the present example, the current 11 will be small (ie in the sub-pico range) given that the diodes (D1,D2) are being used in association with a MEMS sensor. The large impedance value provided by this diode configuration (D1,D2) is advantageous compared to the prior art in that with the prior art, an integrated circuit resistor which would otherwise be used to perform the same function as the diodes would tend to occupy an area of the integrated circuit chip which is considerably larger than is occupied by the diode-pair arrangement.

The first embodiment device includes a biasing circuit (5) which is operatively coupled to the first input terminal (3a) of the buffer amplifier (3) in parallel with the capacitive sensor (1). The biasing circuit (5) includes a resistor-divider (5a) arrangement which can selectably set a bias-voltage at Node V(N_1) as shown in FIG. 1 by setting resistors R1 and R2 to tap a voltage bias source (5b).

The biasing circuit (5) also includes a sub-circuit (5c) represented by the circuitry to the right of imaginary line (A) in FIG. 1. The sub-circuit (5c) includes a plurality of diodes or diode-connected transistors and capacitors which are configured to mirror the voltage bias of node V(N_1) at an output node V(N_2) of the sub-circuit. At node V(N_2), the supply noise produced by $V_{supply}$, and, thermal noise are substantially removed by the diodes D7 to D10 in combination with the capacitors C2 to C3.

Advantageously, the first embodiment device not only enables a precision variable DC-voltage bias signal to be applied to the buffer amplifier (3), but also allows for noise to be effectively removed from the DC-voltage bias signal before it is applied to the buffer amplifier (3). Before outlining mathematically how this is achieved, the following operational conditions of the first embodiment device should be considered:

(i) Current sources 13 and 16 are matched current sources.
(ii) [R(D3)+R(D4)]:[R(D5)+R(D6)]=[R(D7)+R(D8)]:[R(D9)+R(D10)]
(iii) I4>I5 if area of diode (D3, D4, D5, D6)>area of diodes (D7, D8, D9, D10). The ratio is same as ratio of diode areas.
(iv) Capacitors C2 and C3 are used to stabilise the DC level at the node of (D7,D8) and the node of (D9,D10) respectively.
(v) C2 and C3 together with D7 and D10 provide low pass filtering of noise from the biasing network, in particular from the current sources CS1 and CS2, voltage reference V(N_ref) and resistive divider (R1:R2).

Thus, based on the above conditions, it follows that:

$$V(N\_1)=V(N\_ref)*(R2/(R1+R2))$$

Because of operational condition (ii) above, V(N_1)=V(N_2).

Because of operational condition (iii) above, I5 can be set to a relatively small value with proper adjustment of CS1 and CS2 whereby it becomes temperature independent. This implies that the effective resistance of D7, D8, D9, D10 are temperature insensitive.

As a result of the above, V(N_2)=V(N_ref)*(R2/(R1+R2)).

It would be appreciated by a person skilled in the art that V(N_2) has very small noise injected by the voltage supply (5b) and current source (CS1,CS2), and no thermal noise generated by resistor divider (5a). The effective resistance of node V(N_2) is therefore substantially temperature insensitive.

The arrangement of the passive components (eg. capacitors, resistors and current sources) in the biasing circuit (5) as shown in FIG. 1 are configured so that the effective impedance of the diodes (D3-D10) can be controlled within very small variation by adjusting a control current signals CS1 and CS2 which pass through the diodes (D3-D10). The biasing circuit (5) is also relatively less susceptible to changes in temperature and leakage current due to the parallel replication of diodes (D3-D10).

Figure 2:
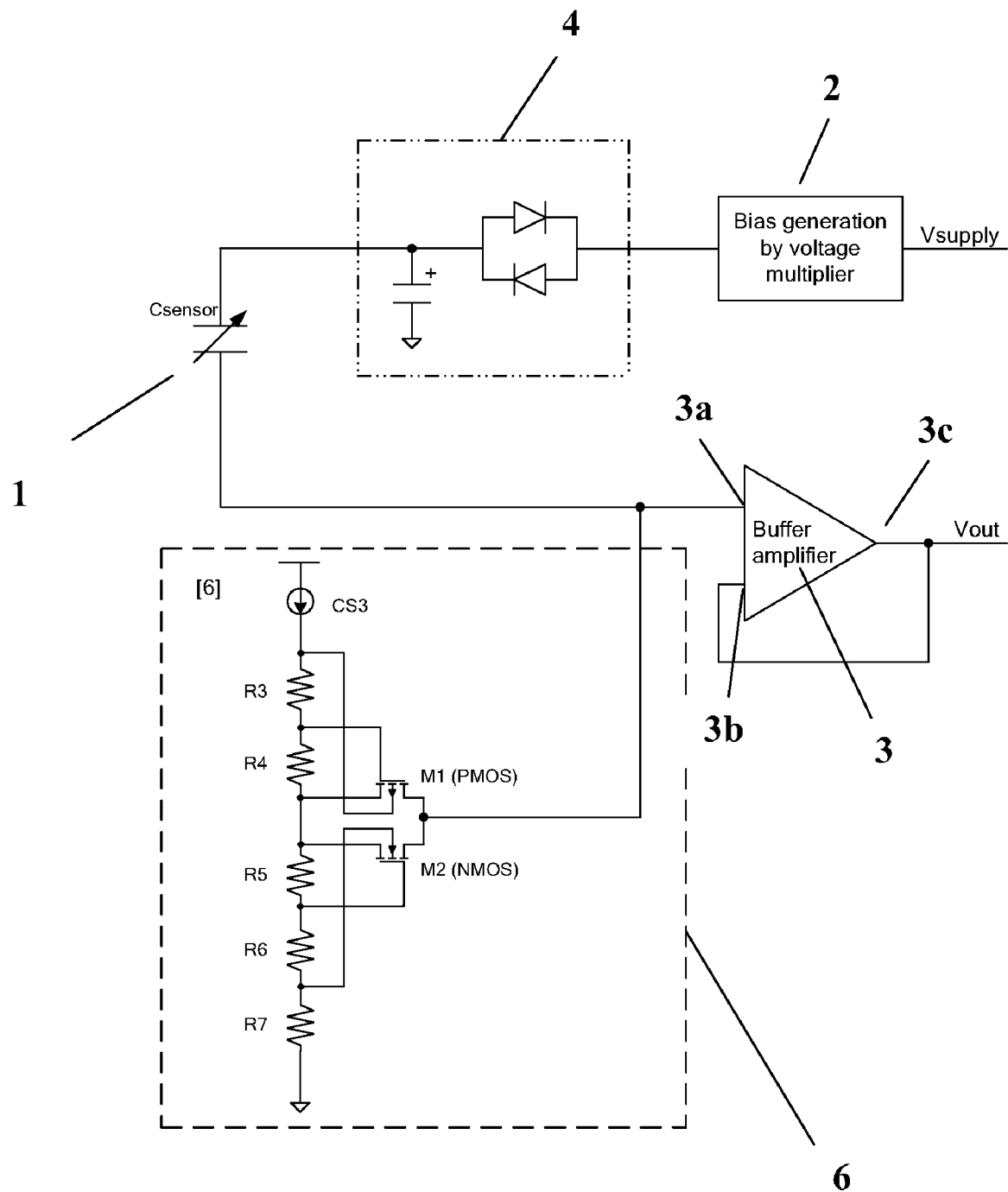
FIG. 2 shows a circuit diagram of a second embodiment of the present invention operatively interfaced with a buffer amplifier.
Figure 3:
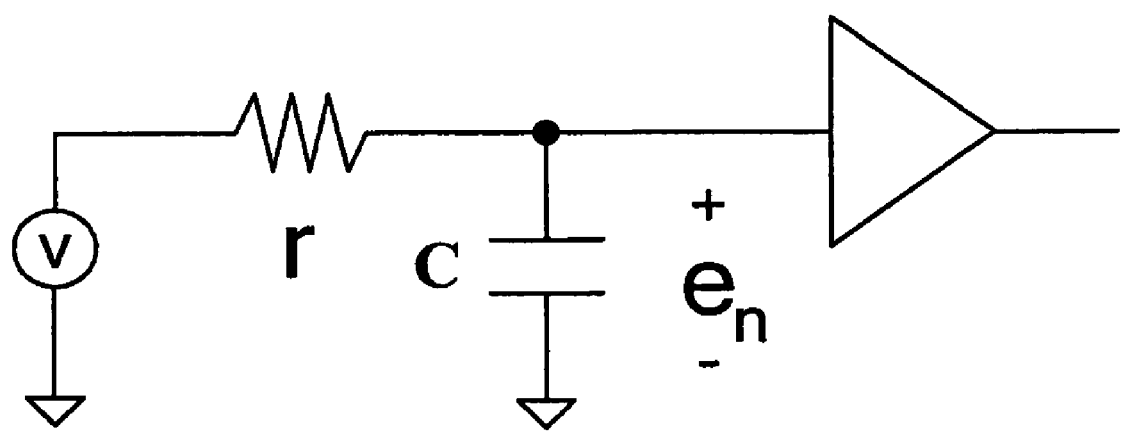
FIG. 3 shows a prior art biasing network.
Figure 4:
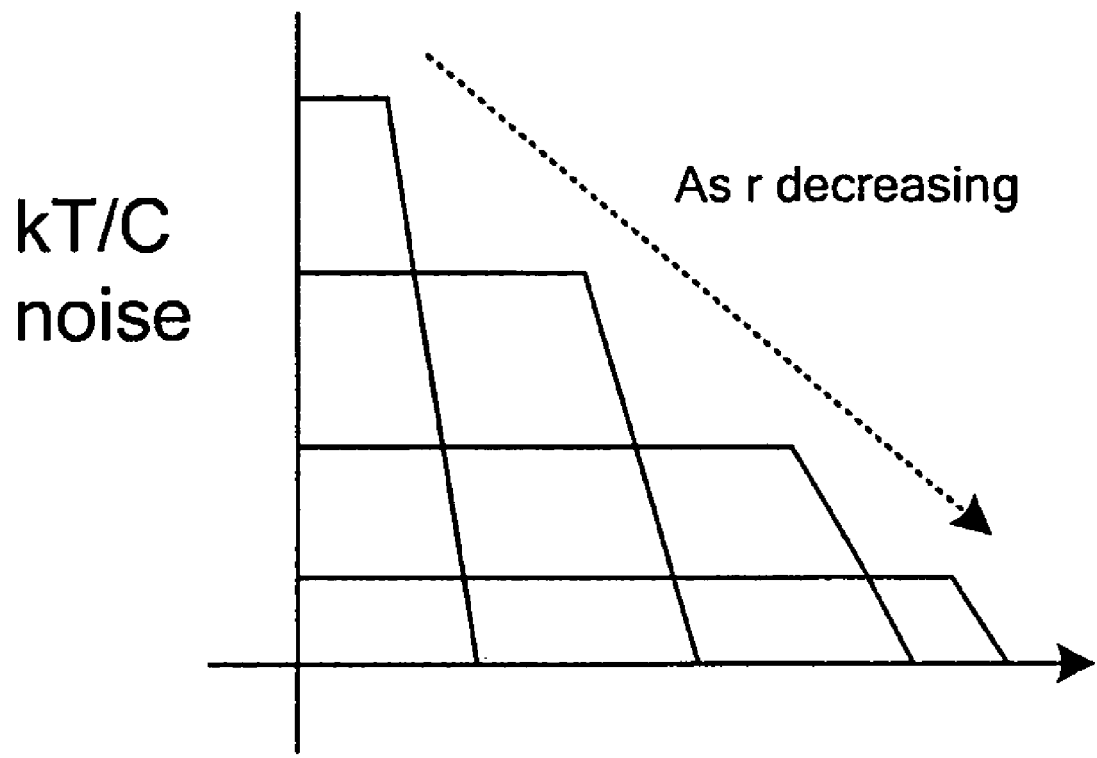
FIG. 4 shows a graph representing the noise generated from the prior art biasing network shown in FIG. 3, as a function of decreasing impedance.

FIG. 2 of the drawings depicts a second embodiment device operatively coupled to a buffer amplifier (3).

It is a low pass network consisting of resistors (R3-R7), current source (CS3) and MOSFETs (M1, M2). Current source CS3 provides a bias current to resistors R3, R4, R5, R6 and R7 whereby a fixed voltage bias is able to be selected. As shown in FIG. 2, the configuration of M1 which is a PMOS device, and, M2 which is an NMOS device, combine to act as a very high value impedance elements. The conductivity of M1 and M2 is controlled by the gate voltage and determined by the subthreshold properties of M1 and M2.

At an application level after the design is fabricated, the conductivity of M1 and M2 can be varied by trimming the resistor R4 and R5 or by connecting the gates of M1 and M2 to different potentials on the resistive ladder so as to alter the overdrive potential between gate-to-source of M1 and M2 respectively.

The low-pass filtering effect is provided by the combination of resistance in M1, M2 and the capacitor $C_{sensor}$. This can be made arbitrarily low (limited by the leakage of the junction leakage of M1 and M2) by adjusting the subthreshold conduction of M1 and M2. This can effectively reduce the in band noise for the signal of interest.

Those skilled in the art will appreciate that the invention described herein is susceptible to variations and modifications other than those specifically described without departing from the scope of the invention. All such variations and modification which become apparent to persons skilled in the art, should be considered to fall within the spirit and scope of the invention as broadly hereinbefore described. It is to be understood that the invention includes all such variations and modifications. The invention also includes all of the steps and features, referred or indicated in the specification, individually or collectively, and any and all combinations of any two or more of said steps or features.

The reference to any prior art in this specification is not, and should not be taken as, an acknowledgment or any form of suggestion that that prior art forms part of the common general knowledge.

What is claimed is:

1. A device for use in biasing a transistor amplifier with a DC-voltage signal, the transistor amplifier including:
   a first input terminal;
   a second input terminal; and
   an output terminal coupled to the second input terminal;
   wherein said device includes:
   a biasing circuit adapted for operative coupling to the first input terminal so as to provide a relatively high biasing impedance to ground at the first input terminal, said biasing circuit being adapted to controllably vary the DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

2. A device as claimed in claim 1 wherein the transistor amplifier includes a FET amplifier.

3. A device as claimed in claim 2 wherein the FET amplifier includes at least one of a MOSFET and a JFET.

4. A device as claimed in claim 1 wherein the first input terminal includes a positive input terminal of the transistor amplifier.

5. A device as claimed in claim 1 wherein the second input terminal includes a negative input terminal of the transistor amplifier.

6. A device as claimed in claim 1 wherein the biasing circuit includes a resistor-divider for controllably varying the DC-voltage signal.

7. A device as claimed in claim 6 wherein the biasing circuit includes a sub-circuit adapted to mirror the DC-voltage signal produced by the resistor-divider at an output node of the sub-circuit.

8. A device as claimed in claim 7 wherein the sub-circuit includes at least one of a diode, a MOSFET and a JFET.

9. A device as claimed in claim 8 wherein the diode, MOSFET and JFET include at least one of a p-n and Schottky-type diode, MOSFET and JFET respectively.

10. A device as claimed in claim 1 wherein the low-pass circuit includes a capacitor operatively coupled with at least one of a diode, a MOSFET, and a JFET of the biasing circuit, wherein the capacitor forms a first low-pass filter with an impedance of the at least one diode, MOSFET and JFET.

11. A device as claimed in claim 1 including a control current source wherein the control current source is adapted to automatically trigger adjustment of an impedance of at least one of a diode, MOSFET and JFET of the sub-circuit whereby said adjustment configures the sub-circuit to mirror the DC-voltage signal of the resistor-divider at the output node of the sub-circuit.

12. A device as claimed in claim 11 wherein the control current source is variable by reference to an output of the resistor-divider.

13. A device as claimed in claim 1 wherein a capacitive sensor is operatively coupled to the first input terminal of the transistor amplifier.

14. A device as claimed in claim 13 wherein the capacitive sensor includes a capacitive sensor of a microphone, said capacitive sensor being adapted to receive a supply voltage signal from a voltage-multiplier device in series with the capacitive sensor.

15. A device as claimed in claim 14 wherein a second low-pass filter is operatively coupled between the voltage multiplier device and the capacitive sensor, said second low-pass filter being adapted to filter out a voltage ripple in the supply voltage signal before the supply voltage signal is fed to the capacitive sensor, the voltage ripple being produced during voltage step-up conversion of the supply voltage signal by the voltage multiplier device.

16. A device as claimed in claim 15 wherein the low-pass filter includes a capacitor operatively coupled with a first and second diode, said first and second diodes being coupled in parallel between a terminal of the capacitor and an output terminal of the voltage multiplier device, said diodes being arranged in reverse polarity relative to each other whilst in the parallel configuration.

17. A device as claimed in claim 1 wherein the sub-circuit of the biasing circuit includes a PMOS and an NMOS MOSFET, wherein the drains of the PMOS and NMOS MOSFETs are operatively coupled to the first input terminal of the transistor amplifier, and gates of the PMOS AND NMOS MOSFETS are operatively coupled to different voltage potentials of the resistor-divider.

18. A device as claimed in claim 17 wherein at least one of the PMOS and NMOS MOSFETS are adapted to form a low-pass filter with the capacitive sensor coupled to the first input terminal of the transistor amplifier.

19. A device as claimed in claim 1 wherein the device is fabricated on an integrated circuit chip.

20. A transistor amplifier including:
   a first input terminal;
   a second input terminal;
   an output terminal coupled to the second input terminal; and
   a biasing circuit adapted for operative coupling to the first input terminal so as to provide a relatively high biasing impedance to ground at the first input terminal, said biasing circuit being adapted to controllably vary a DC-voltage signal which biases the transistor amplifier, whilst at least one component of the biasing circuit is configured to simultaneously form a low-pass circuit for filtering a noise component of the DC-voltage signal before the DC-voltage signal is provided to the first input terminal.

21. A method of biasing a transistor amplifier with a DC-voltage signal, the transistor amplifier including:
   a first input terminal;
   a second input terminal; and
   an output terminal coupled to the second input terminal;
wherein the method includes the steps of:
   (a) operatively coupling a biasing circuit to the first input terminal, wherein said biasing circuit is adapted to provide a relatively high biasing impedance to ground at the first input terminal;
   (b) selectably adjusting the DC-voltage signal with the biasing circuit, wherein at least one component of the biasing circuit is configured to simultaneously form a low-pass circuit for filtering a noise component of the DC-voltage signal before the DC-voltage signal is provided to the first input terminal.

* * * * *